United States Patent
Coppola

(10) Patent No.: US 9,370,132 B2
(45) Date of Patent: Jun. 14, 2016

(54) HOMOGENEOUS EMI VENT PANEL AND METHOD FOR PREPARATION THEREOF

(71) Applicant: PARKER-HANNIFIN CORPORATION, Cleveland, OH (US)

(72) Inventor: Stephen J. Coppola, Boston, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 14/331,604

(22) Filed: Jul. 15, 2014

(65) Prior Publication Data

US 2015/0060131 A1 Mar. 5, 2015

Related U.S. Application Data

(60) Provisional application No. 61/870,484, filed on Aug. 27, 2013.

(51) Int. Cl.
*H05K 9/00* (2006.01)

(52) U.S. Cl.
CPC .................................... *H05K 9/0041* (2013.01)

(58) Field of Classification Search
CPC .................................................. H05K 9/0041
USPC ........................................................ 174/383
See application file for complete search history.

(56) References Cited

U.S. PATENT DOCUMENTS

| | | |
|---|---|---|
| 3,231,663 A | 1/1966 | Schwartz |
| 3,546,359 A | 12/1970 | Ciccarelli |
| 3,553,343 A | 1/1971 | Garlington |
| 3,580,981 A | 5/1971 | Lamp |
| 3,584,134 A | 6/1971 | Nichols |
| 3,821,463 A | 6/1974 | Bakker |
| 4,249,033 A | 2/1981 | Darakjy |
| 4,616,101 A | 10/1986 | Veerman |
| 4,857,668 A | 8/1989 | Buonanno |
| 4,952,448 A | 8/1990 | Bullock |
| 5,007,946 A | 4/1991 | Babini |
| 5,028,739 A | 7/1991 | Keyser |
| 5,032,689 A | 7/1991 | Halligan |
| 5,105,056 A | 4/1992 | Hoge, Jr. |
| 5,142,101 A | 8/1992 | Matsuzaki |
| 5,202,536 A | 4/1993 | Buonanno |
| 5,401,914 A | 3/1995 | Curran |

(Continued)

FOREIGN PATENT DOCUMENTS

| | | |
|---|---|---|
| JP | 8064988 | 3/1996 |
| WO | WO 9732459 A1 | 9/1997 |
| WO | 2006/042209 A2 | 4/2006 |

OTHER PUBLICATIONS

Extended European Search Report for corresponding Application No. 14178136.9 dated Apr. 10, 2015.

(Continued)

*Primary Examiner* — Hung V Ngo
(74) *Attorney, Agent, or Firm* — Renner, Otto, Boisselle & Sklar, LLP

(57) ABSTRACT

A homogeneous EMI shielded vent panel is provided. The vent panel has an interior porous section and an exterior frame for attachment to an opening of an electronic enclosure. The vent panel can be fabricated using selective laser sintering technology to avoid the use of multiple parts and components which can generate harmful foreign object debris during fabrication and mounting of the vent panel.

7 Claims, 2 Drawing Sheets

(56) References Cited

U.S. PATENT DOCUMENTS

| | | | |
|---|---|---|---|
| 5,895,885 A | 4/1999 | Kunkel | |
| 5,910,639 A | 6/1999 | Kunkel | |
| 5,928,076 A * | 7/1999 | Clements et al. | 454/184 |
| 6,211,458 B1 | 4/2001 | Mitchell | |
| 6,252,161 B1 * | 6/2001 | Hailey et al. | 174/383 |
| 6,362,417 B2 | 3/2002 | Mitchell | |
| 6,426,459 B1 | 7/2002 | Mitchell | |
| 6,710,241 B2 | 3/2004 | Casper | |
| 6,947,294 B2 * | 9/2005 | Lin et al. | 361/818 |
| 7,038,124 B1 | 5/2006 | Sosnowski | |
| 7,371,977 B1 * | 5/2008 | Preonas | 174/383 |
| 7,575,708 B2 | 8/2009 | DeGrange | |
| 2003/0117786 A1 | 6/2003 | Chang et al. | |
| 2004/0233654 A1 | 11/2004 | Lin et al. | |
| 2011/0241546 A1 * | 10/2011 | Blandford, III | H01J 65/044 315/85 |
| 2012/0098431 A1 * | 4/2012 | Liu | F21V 11/06 315/85 |

OTHER PUBLICATIONS

Thornwood, "Diagonal Grille Pattern for Improved Product Fragility", IBM Technical Disclosure Bulletin, vol. 38, No. 8, Aug. 1995, p. 467.

Anonymous, "Air Intake/Exhaust Apertures for Electronic Enclosures", Research Disclosure, vol. 343, No. 18, Nov. 1992, one page.

* cited by examiner

HOMOGENEOUS EMI VENT PANEL AND METHOD FOR PREPARATION THEREOF

CROSS-REFERENCE TO RELATED APPLICATIONS

This application claims priority to U.S. Provisional Patent Application No. 61/870,484, filed Aug. 27, 2013, the disclosure of which is incorporated herein in its entirety by reference thereto.

BACKGROUND OF THE INVENTION

The present invention relates to a homogeneous EMI shielded vent comprising an electrically conductive frame element and a porous shielding element. The vent structure is formed as a single integrated and homogenous part using a selective laser sintering (SLS) technique. The vent structure of the invention can be formed into a variety of complex shapes and configurations, and does not require the use of solders, conductive adhesives, or mechanical bonding techniques frequently used for fabricating EMI vent panels. Advantageously, the porous shielding element is a honeycomb structure containing interconnected cells providing both adequate ventilation and reliable EMI shielding.

The homogenous EMI shielding vent of the invention is designed to cover a ventilation opening in an electronics housing or other device, and is particularly adapted for use in aircraft and military environments where foreign object debris ("FOD") is a persistent problem. Foreign object debris is created in current vent panels, which are constructed from a separate frame and filter media, when these separate components are cut and installed.

The vent panel of the invention is a homogenous structure configured to accommodate the flow of cooling air into the enclosure while maintaining electrical continuity and EMI shielding effectiveness across the opening. Since the structure is a one-piece or homogenous part, the use of devices for attaching the separate vent panel elements is eliminated. Such attachment devices include soldering, plating, conductive epoxy coatings, and mechanical attachments which can be incidental rather than permanent attachments. The elimination of these various attachment methods serves to improve the overall performance of the vent, avoid problems due to a failure of attachment devices, and improve corrosion resistance.

In general, the operation of electronic devices such as monitors, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI". EMI is known to interfere with the operation of other proximate electronic devices. "EMI" is used herein interchangeably with the term "radio frequency interference" ("RFI").

For attenuating EMI effects, suitable shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and most often is configured as an electrically conductive and grounded housing or other enclosure which surrounds the EMI generating circuitry of the source device. However, when such circuitry is contained within the confined space of an enclosure, it often is necessary to provide a cooling or ventilation means to dissipate the heat which is generated by the circuitry. Most enclosures therefore are formed with one or more air intake and/or exhaust openings or ports for natural or forced convective circulation of air between the interior of the enclosure and the ambient environment.

Left uncovered, such openings would represent a discontinuity in the surface and ground conductivity of the enclosure, with the result of a decrease in the EMI shielding effectiveness of the enclosure. Accordingly, shielded vent panels have been used for covering the openings in an manner which allows ventilation of the enclosure while electrical continuity, i.e., grounding, across the vent opening is maintained.

In basic construction, such vent panels, which are sized to span the corresponding opening in the enclosure, conventionally are formed from a sheet of a porous, electrically-conductive shielding media, i.e. a vent opening, and an electrically-conductive frame member configured to support the media by extending about the outer periphery thereof. The vent panels may also be stamped or cast. The media, which may be an expanded metal mesh or, alternatively, a honeycombed-structured or other cellular structured metal foil, is received in or is otherwise attached to the frame, which typically is provided as an extruded aluminum, stainless steel, Monel, or other metal profile. The frame, in turn, may be fastened to the enclosure over the opening thereof with screws or the like, and a compressible, electrically-conductive seal or gasket optionally provided for improved electrical contact between the frame and the enclosure.

However, for electrical continuity to be maintained across the opening, good electrical contact must be provided not only between the frame and the enclosure, but also between the media and the frame. In this regard, conventional panels may employ a C-shaped frame channel or other extrusion including a V-shaped or other projection or edge integrally formed within one of the sides of the channel. With the periphery of the media being received within the channel, the sides thereof are compressed to cause the projection or edge to penetrate into the media and thereby establish good electrical contact. Vent panels of such type are marketed commercially by the Chomerics Division of the Parker-Hannifin Corp. under the tradenames "Cho-Cell™", "Shield Cell®", "Omni Cell®", "Slimvent™", and "Streamshield™". Alternatively, the media may be fit into the frame and then bonded thereto using a conventional joining technique such as resistance welding, brazing, soldering, or the like. Vent panels of this type are also marketed commercially by the Chomerics Division of Parker-Hannifin Corp.

EMI shielding vents are also described in the following patents: U.S. Pat. Nos. 6,426,459; 6,362,417; and 6,211,458; 5,032,689; 6,710,241; 7,038,124; and 7,575,708. Other vents and materials therefore are described in U.S. Pat. Nos. 3,546,359; 3,580,981; 3,553,343; 3,584,134; 3,821,463; 4,616,101; 4,249,033; 4,616,101; 5,007,946; 5,401,914; 5,895,885; and 5,910,639, JP 8064988, and WO 97/32459.

In view of the proliferation of electronic devices, it is to be expected that continued improvements in EMI shielded vent panels would be well-received by industry, and particularly by the designers of enclosures for personal computers, file servers, telecommunication equipment, and similar systems which now operate at frequencies of 500 MHz or more. Indeed, as the processing speeds of electronic devices continue to increase with the attendant generation of higher frequency EMI radiation and greater heat output, enclosure designers are faced with the seemingly competing requirements of providing both adequate ventilation and effective EMI shielding. In such applications, a honeycomb shielding media, such as is disclosed in U.S. Pat. Nos. 3,821,463; 5,895,885; 5,910,639, often may be preferred over other media as it is known to provide effective EMI shielding at higher frequencies with less restriction to air flow. Moreover, certain applications may specify a cast or similar-type frame construction which, in contrast to an extrusion, may be formed without corner seams and, as a result, may be made more structurally rigid and may be formed into more complex shapes. Ultimately, a preferred vent construction would be economical to manufacture, and would exhibit both reliable EMI shielding performance and good ventilation even in high frequency applications.

Ideally, the EMI vent panel would be fabricated from a single metal structure to form a homogenous part which would avoid the above complications associated with the joining of separate media and frame elements. This type of fabrication has not heretofore been possible due to issues of cost and fabrication technique limitations.

Recently, several fabrication techniques have been proposed for use in the manufacture of complex metal parts and structures. See, for instance, U.S. Pat. No. 7,575,708, which describes a process for manufacturing aerospace parts from a powdered nylon material using a selective laser sintering technique.

It will be appreciated that it would be of considerable advantage to develop an improved vent panel which exhibits reliable EMI shielding and air flow characteristics, which is economical to manufacture, which has structural integrity, and which ideally would be a one-piece homogenous construction. These and other advantages will be readily apparent to those skilled in the art based upon the disclosure contained herein.

The disclosure of each of the patents set forth above is incorporated by reference herein in their entirety.

SUMMARY OF THE INVENTION

The present invention is directed generally to a homogenous EMI shielding vent panel fabricated from an electrically conductive material. The vent panel includes an external frame element circumscribing an internal porous media element, both of which are fabricated from the conductive material. The conductive material can be a metal, such as titanium, aluminum, steel, stainless steel, nickel, Monel, or combinations or alloys of these metals. Alternatively, the conductive material can be a suitable plastic having a conductive filler in an amount sufficient to impart EMI shielding properties to the plastic material.

The homogenous or unitary vent panel of the invention avoids the use of solders, conductive adhesives or mechanical devices required to attach the media to the frame, while permitting reliable EMI shielding and air flow characteristics. The vent panel is therefore suitable for use as an enclosure for computer and electronics components and systems, and can avoid the creation of potential foreign object debris ("FOD") which would occur when mounting and assembling vent panels having multiple components.

In one embodiment, the media of the invention is a porous structure comprising a plurality of cells. In one aspect, the cells are arranged in a honeycomb structure with individual cells having circular, oval, octagonal, hexagonal, square or rectangular shapes.

In another embodiment, the vent panel is fabricated using a selective laser sintering ("SLS") technique. This technique enables the fabrication of the part as a single or homogeneous object even though there are numerous complex cells comprising the media structure.

In a further embodiment, a suitable EMI gasket can be combined with the vent panel to form a vent panel assembly for attachment to an opening for an electronics enclosure.

The present invention, accordingly, comprises the homogenous EMI shielded vent panel possessing the combination of elements and construction as exemplified in the detailed disclosure to follow. The foregoing aspects and embodiments of the invention are intended to be illustrative only, and are not meant to restrict the spirit and scope of the claimed invention.

BRIEF DESCRIPTION OF THE DRAWINGS

The foregoing and other advantages and features of the invention will become apparent upon reading the following detailed description with reference to the accompanying drawings in which.

Figure 1:
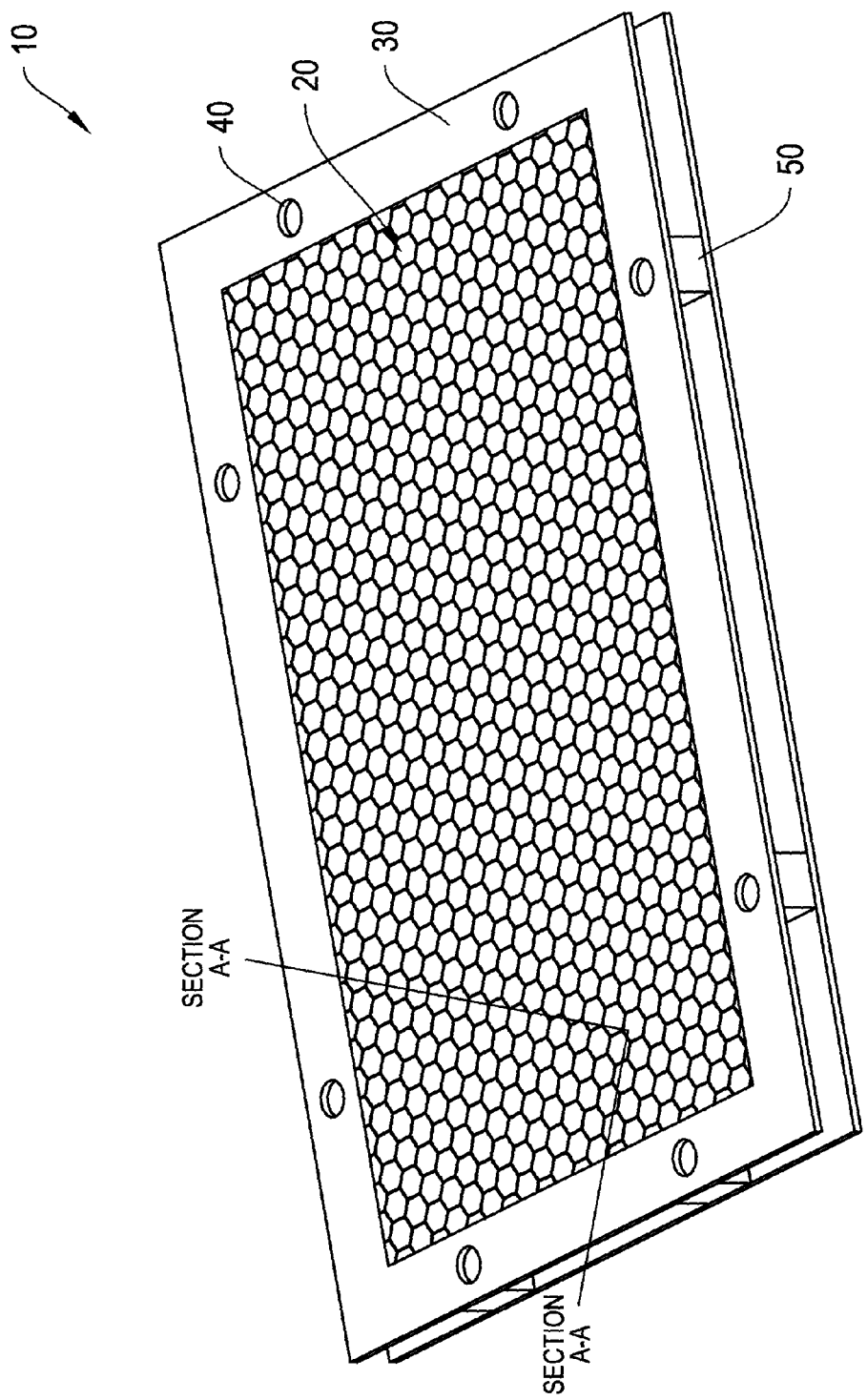
FIG. 1 is a perspective view of one embodiment of the homogeneous EMI shielding vent panel of invention.

The drawings will be described further in connection with the following Detailed Description of the Invention.

DETAILED DESCRIPTION OF THE INVENTION

Certain terminology may be employed in the following description for convenience rather than for any limiting purpose. For example, the terms "forward" and "rearward", "front" and "rear", "right" and "left", "upper" and "lower," "top" and "bottom," and "right" and "left" designate directions in the drawings to which reference is made, with the terms "inward," "inner," "interior "inboard" and "outward," "outer," "exterior," "outside," or "outboard" referring, respectively, to directions toward and away from the center of a referenced element, the terms "radial" or "vertical" and "axial" or "horizontal" referring, respectively, to directions or planes perpendicular and parallel to the longitudinal central axis of a referenced element, i.e. along an x-axis and a y-axis (commonly the length and width). The "thickness" of an element is intended to denote a direction along a z-axis which extends vertically from the plane of the x-axis and y-axis. Terminology of similar import other than the words specifically mentioned above likewise is to be considered as being used for purposes of convenience rather than in any limiting sense.

The term "foreign object debris" or "FOD" is intended to denote the presence of material or debris, such as debris formed as a result of the fabrication or joining of separate elements or components, which can potentially result in damage to components and parts.

A "homogenous", "single", "one-piece" or "unitary" object, as that phrase is used herein, is intended to denote an integral object not formed by joining two or more separate objects or pieces.

"Selective laser sintering" or "SLS", as used herein, is intended to denote a process or processes involving the use of a high power laser for fusing small particles of metal (not plastic) into a mass having a desired 3-dimensional shape. In the context of this invention, SLS is also intended to include related technologies, or related descriptions, such as direct metal laser sintering ("DMLS"), direct selective laser sintering, selective laser melting ("SLM"), and selective laser powder remelting ("SLPR"). In operation, these processes use a laser to selectively fuse powdered metal by scanning cross sections generated from a 3-dimensional description of a part, for instance from a CAD file or scanned data, on the surface of a bed of powdered metal. After each cross-section is scanned, the powder bed is lowered by one layer thickness, a new layer of material is applied on top, and the process is repeated until the part is completed. Newer technologies utilize lasers which are capable of completely melting the metal powder to form non-porous metal layers of high structural integrity. It is to be understood that the vent panel of the invention is fabricated from one or more metals using SLS technology as defined herein.

As used herein, the term "aircraft" is intended to designate both commercial and military aircraft, jet and prop aircraft, including both large commercial and smaller private aircraft.

In the figures, elements having an alphanumeric designation may be referenced herein collectively or in the alternative, as will be apparent from the context, by the numerical portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows or underscores.

The homogenous EMI shielding vent panel of the invention is fabricated from a conductive metal using SLS. The vent panel includes an interior porous or honeycomb section and an exterior circumscribing frame section. The frame section is used for mounting the vent panel onto the opening of an electronics enclosure, such as an EMI shielding housing, using an EMI shielding gasket. The entire vent panel and gasket assembly imparts EMI shielding to the enclosure. Suitable metals for fabricating the vent panel include titanium, aluminum, steel, stainless steel, nickel, Monel, or alloys of these metals. The vent can be mounted to the electronics enclosure in a conventional manner using, for example, screws, bolts, or other fastening members, over a corresponding opening formed within the housing. Such opening generally will be formed as having a predefined outer margin about which the panel may border to cover the opening in a manner providing ventilation without compromising the EMI shielding effectiveness of the housing. As used herein, the term "EMI shielding" should be understood to include, and to be used interchangeably with, electromagnetic compatibility (EMC), surface grounding, corona shielding, radio frequency interference (RFI) shielding, and anti-static, i.e., electrostatic discharge (ESD), protection.

It will be appreciated, however, that aspects of the present invention may find utility in other EMI shielding applications. For example, the panel of the invention alternatively may be mounted onto the wall of an EMI shielded room for covering a ventilation opening thereof. Such other applications therefore should be considered to be expressly within the scope of the present invention.

Referring to the figures wherein corresponding reference characters are used to designate corresponding elements throughout the several views with equivalent elements being referenced with prime or sequential alphanumeric designations, an exemplary homogenous EMI shielding vent panel in accordance with the present invention is shown generally at 10 in the perspective view of FIG. 1. In basic construction, and as may be seen with additional reference to the sectional view of FIG. 2, panel 10 includes an electrically-conductive internal media, 20, which may be generally-planar in configuration, and an external electrically-conductive frame, referenced generally at 30.

For illustrative purposes, the media 20 is shown as a series of interconnected hexagons joined together in the shape of a honeycomb pattern. If a honeycomb pattern is desired, the individual cells of the honeycomb can be of any desired shape or dimension, including rectangular, square, oval, circular, octagonal or hexagonal. The overall geometry of the vent panel can be sized and shaped to fit over a correspondingly dimensioned opening in an enclosure. This may depend upon the configuration of the enclosure opening, however in general the vent panel may be of any shape and size.

Frame 30 is shown as a general C-shaped construction facing away form the media with vertical posts through which holes are provided for attachment of the vent panel to the enclosure opening as described herein. Frame 30 may be divided into two or more individual sections by one or more frame dividers.

The thickness of the vent panel may be of any dimension, but is preferably in the range of between about 1/64-1.5 inch (0.4-38 mm). Media 20 is preferably provided as a honeycomb having a hexagonal or other cellular structure which is "open" or otherwise porous to admit the flow of cooling air therethrough for the ventilation of the associated housing or other electronics enclosure. Each of the cells define a corresponding ventilation passageway for the media 20 extending through the thickness direction thereof generally along or parallel to the thickness of the vent panel.

Figure 2:
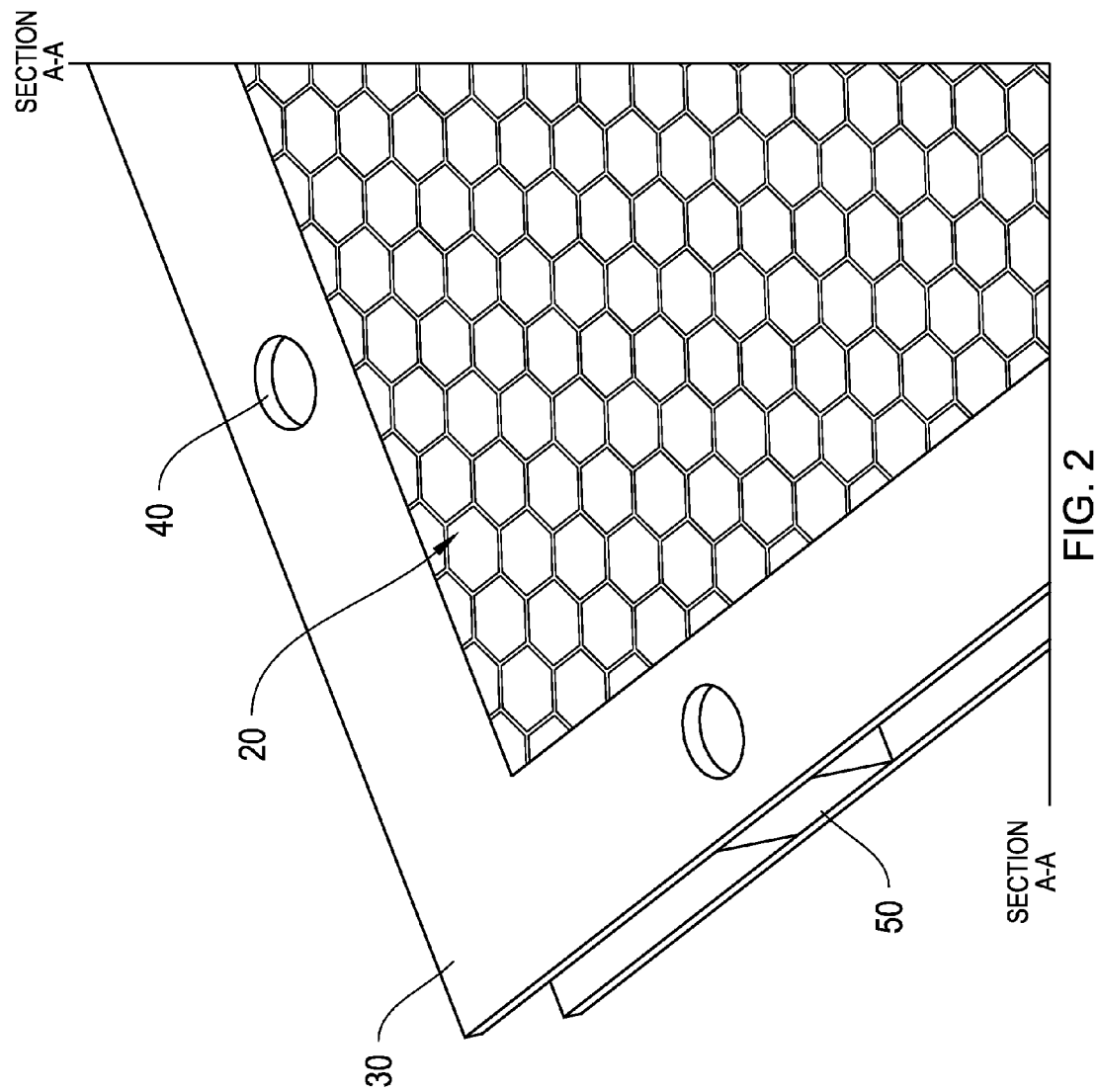
FIG. 2 is a sectional view taken along section A-A of the homogeneous EMI shielding vent depicted in FIG. 1.

FIG. 2 is a detailed sectional exploded view of a corner of the vent panel, taken along section A-A showing the individual hexagonal cells comprising the honeycomb structure of the media.

Optionally, a dust filter (not shown) may be employed in conjunction with media 20 disposed parallel thereto in a series arrangement relative to the air flow direction. Such filter may be formed of a screen or a high porosity foam or the like which allows sufficient air flow therethrough while reducing the transmission of dust or other airborne contaminants into the enclosure. The filter may be attached to the outside, relative to the enclosure, of the frame in a conventional manner, but preferably is made to be removable for easier cleaning and replacement.

Vent panel 10 is preferably formed from a metal such as zinc, stainless steel, steel, aluminum, magnesium, titanium, or a combination or alloy thereof. Such metal may itself be coated or plated with nickel or other metal or material which may be corrosion resistant, and otherwise may be surface treated such as by nitriding or chromate conversion. Vent panel 10 is formed by a selective laser sintering (SLS) process as previously described.

In the installation of vent panel 10 within an EMI shielding enclosure or the like, the outside face of the frame section 30 may be disposed about a corresponding opening of the enclosure and in electrically-conductive contact therewith. In order to lower the impedance across the frame-housing interface, an electrically conductive seal or gasket member (not shown) conventionally may be mounted onto the face of the frame, or as otherwise interposed between that surface and the enclosure surface. Such gasket may be constructed as having a resilient core element affording gap-filling capabilities which is either loaded, sheathed, or coated with an electrically conductive element. The resilient core element, which may be foamed or unfoamed, solid or tubular, typically may be formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone. Conductive materials for the filler, sheathing or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be an all-metal, knitted wire construction, or a formed-in-place (FIP) bead of a curable, electrically-conductive silicone or urethane composition which is dispensed in a fluent state onto the surface of the frame or housing and then cured or foamed in situ via the application of heat or with atmospheric moisture.

The panel 10 may be mounted onto the surface of the enclosure using screws, bolts, or other fastening members which may be received though holes, referenced at 40, through the frame member 30. Mounting holes 40 can be conveniently provided between the adjacent faces of the frame. Alternatively, panel 10 may be attached to the surface of the enclosure using an electrically conductive adhesive, or otherwise as configured for an interference fit within the enclosure opening.

Thus, an EMI shielded vent panel construction for an electronics enclosure is described which exhibits reliable EMI shielding in ensuring the grounding of the enclosure across the vent opening. Such construction is economical to manufacture using SLS technology, provides good electrical contact between the shielding media and the frame, and allows for the use of vent panels having a complex geometry. Additionally, since the vent panel of the invention is a homogeneous structure, no conductive adhesives or mechanical devices required to attach the media to the frame. The vent panel is thereby suitable for use as an enclosure for computer and electronic components and systems, and can avoid the creation of potential damaging foreign object debris (FOD) which would occur when mounting and assembling vent panels having multiple components.

The vent panels of the invention can be used in a variety of applications and under a variety of conditions. Typical applications include vent panels for electronics used in military and civilian aircraft.

As it is anticipated that certain changes may be made in the present invention without departing from the precepts herein involved, it is intended that all matter contained in the foregoing description shall be interpreted in as illustrative rather than in a limiting sense. All references including any priority documents cited herein are expressly incorporated by reference.

What is claimed is:

1. An EMI shielded vent panel for disposition over a corresponding opening of an electronics enclosure comprising
    a single homogeneous structure comprising an exterior frame section and an interior medium section,
    the exterior frame section having a generally C-shaped cross-sectional profile with the opening of the C facing away from the interior medium section, the frame section including mounting holes for receiving fastening members, said frame section being adapted for mounting the vent panel onto a surface of the electronics enclosure to cover the opening of an electronics enclosure, and
    the interior medium section is circumscribed by the exterior frame section and further comprising a plurality of cells defining a plurality of ventilation passageways extending through the thickness of the medium,
    said vent panel being fabricated using a selective laser sintering (SLS) process from an electrically-conductive metal capable of EMI shielding; the metal selected from among aluminum, stainless steel, nickel, titanium, and alloys and mixtures thereof and adapted to circumscribe the opening of the electronics enclosure.

2. The vent panel of claim 1 wherein the medium comprises a honeycomb structure.

3. The vent panel of claim 2 wherein the individual cells are circular or oval.

4. The vent panel of claim 2 wherein the individual cells are square or rectangular.

5. The vent panel of claim 2 wherein the individual cells are hexagonal or octagonal.

6. An EMI shielded vent assembly comprising the EMI vent panel of claim 1 and an EMI gasket for mounting the vent panel to the opening in the electronics enclosure.

7. The EMI shielded vent assembly of claim 6 which is mounted in an aircraft.

* * * * *